United States Patent
Tremblay et al.

(10) Patent No.: US 9,206,998 B2
(45) Date of Patent: Dec. 8, 2015

(54) SELF-TRACKING SOLAR CONCENTRATOR

(71) Applicant: ECOLE POLYTECHNIQUE FEDERALE DE LAUSANNE (EPFL), Lausanne (CH)

(72) Inventors: Eric Tremblay, St. Sulpice (CH); Christophe Moser, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 14/390,179

(22) PCT Filed: Apr. 3, 2013

(86) PCT No.: PCT/IB2013/052649
§ 371 (c)(1),
(2) Date: Oct. 2, 2014

(87) PCT Pub. No.: WO2013/150453
PCT Pub. Date: Oct. 10, 2013

(65) Prior Publication Data
US 2015/0063751 A1    Mar. 5, 2015

(30) Foreign Application Priority Data

Apr. 3, 2012 (WO) .................. PCT/IB2012/051631

(51) Int. Cl.
| G02B 6/32 | (2006.01) |
| F24J 2/38 | (2014.01) |
| F21V 8/00 | (2006.01) |
| H01L 31/054 | (2014.01) |
| G01S 17/66 | (2006.01) |
| G02B 6/42 | (2006.01) |

(52) U.S. Cl.
CPC .. *F24J 2/38* (2013.01); *G01S 17/66* (2013.01); *G02B 6/0013* (2013.01); *G02B 6/32* (2013.01); *G02B 6/4295* (2013.01); *H01L 31/0543* (2014.12); *H01L 31/0547* (2014.12); *H01L 31/0549* (2014.12); *Y02E 10/52* (2013.01)

(58) Field of Classification Search
CPC ...... G02B 6/32; G02B 6/4206; G02B 6/4204; Y02E 10/50; H01L 31/022425; H01L 31/02168
USPC ........... 385/33, 88–90, 36; 136/244–246, 259
See application file for complete search history.

(56) References Cited

U.S. PATENT DOCUMENTS

| 8,040,609 B1 | 10/2011 | Schmaelzle et al. |
| 2012/0056081 A1 | 3/2012 | Kozodoy |
| 2014/0261622 A1* | 9/2014 | Floyd et al. .................. 136/246 |

FOREIGN PATENT DOCUMENTS

DE    10 2008 037965    2/2010

OTHER PUBLICATIONS

International Search Report for PCT/IB2013/052649, mailed Sep. 12, 2013.

(Continued)

*Primary Examiner* — Ellen Kim
(74) *Attorney, Agent, or Firm* — Nixon & Vanderhye P.C.

(57) ABSTRACT

A system for capturing solar light of the sun, whereby the solar light comprises a short wavelength light component and a long wavelength light component. The system comprises at least a lens (101), a light-guide (102), and a self-adaptive coupling feature (103). The at least one lens is arranged adjacent to the light-guide in order to focus the long wavelength component onto the self-adaptive coupling feature, and the self-adaptive coupling feature is configured to couple the short wavelength light component into the light-guide.

11 Claims, 11 Drawing Sheets

(56) References Cited

OTHER PUBLICATIONS

Written Opinion of the ISA for PCT/IB2013/052649, mailed Sep. 12, 2013.

Baker et al., "Reactive self-tracking solar concentrators: concept, design, and initial materials characterization", *Applied Optics*, vol. 51, No. 8, Mar. 10, 2012, pp. 1086-1094.

\* cited by examiner

SELF-TRACKING SOLAR CONCENTRATOR

This application is the U.S. national phase of International Application No. PCT/IB 2013/052649 filed 3 Apr. 2013 which designated the U.S. and claims priority to International Application No. PCT/IB 2012/051631 filed 3 Apr. 2012, the entire contents of each of which are hereby incorporated by reference.

FIELD OF THE INVENTION

The present invention relates to solar energy and solar lighting systems, in particular, those systems that operate at least in part by way of concentrating sunlight for the purposes of converting sunlight to electricity or channeling sunlight into buildings for lighting.

BACKGROUND

Solar energy capture is a topic of widespread interest and importance due to rising worldwide energy consumption and demands on existing energy sources. With a number of very strict constraints placed on solar energy systems, much of work in this field is aimed at simultaneously improving system performance while reducing costs. Solar concentration is one approach to reducing costs by using materials that are less expensive than photovoltaic (PV) cells for light collection and concentration and deliver the light onto a smaller area PV cell. However, solar concentrators have particular disadvantages compared to non-concentrating systems. One drawback is the requirement for precise alignment of the optics for moderate to large concentration (>10× approximately). These systems require active tracking mechanisms to follow the sun's position, which adds significantly to the cost and complexity of the system. It would therefore be advantageous if a mechanism to self-track the sun's position could be developed. This cannot be accomplished with passive, static optics and must involve a mechanism that actively self-adapts or reconfigures the optical system in response to the sun's location.

SUMMARY OF THE INVENTION

The present invention provides a device structure and physical mechanism to allow a solar concentrator to "self-track" the sun, or follow the sun's position reactively. This self-tracking mechanism allows for several solar concentrator system embodiments including
1) a solar concentration system without any external active mechanical tracking, or
2) a solar concentrating system with coarse mechanical alignment for which fine alignment is achieved by the self-tracking mechanism of the present invention.

In at least one embodiment, the present invention relates to a system and method for capturing solar energy. The system first includes a lens or plurality of lenses arranged adjacent to a light-guide. Adjacent and below the light-guide is an in-plane actuator for coupling short wavelength light into the light-guide. In one embodiment, the actuator device consists of a phase change material combined with an infrared absorber below and in contact with but not limited to an array of dichroic beam splitter prisms formed on a transparent elastomer that acts to transmit the long wavelength light into the infrared light absorbent phase-change material and reflect the short wavelength light into the light-guide. When sufficient long wavelength energy is focused on the phase-change material, it will locally change from its solid to liquid state thereby undergoing a localized volume expansion, which serves to deflect the dichroic prism layer and transparent elastomer into contact with the light-guide. When the elastomer layer makes contact with the light-guide, the prism array is designed such that short wavelength light will be efficiently coupled into the light-guide by frustrated total internal reflection (FTIR) at the location of the contact. The location of this in-plane actuation is co-located with the focus of the sunlight and therefore follows the angular position of the sun for a self-adaptive, self-tracking solar concentrator.

Accordingly, in a first aspect, the invention provides a system for capturing solar light of the sun, whereby the solar light comprises a short wavelength light component and a long wavelength light component. The system comprises at least a lens, a light-guide, and a self-adaptive coupling feature. The at least one lens is arranged adjacent to the light-guide in order to focus the long wavelength component onto the self-adaptive coupling feature, and the self-adaptive coupling feature is configured to couple the short wavelength light component into the light-guide.

In a first preferred embodiment, the self-adaptive coupling feature comprises a mechanical actuator that is configured to be thermally induced by absorbing the long wavelength light component and to be reversible, a transparent elastomer, and at least a reflecting prism. The at least one reflecting prism is arranged between the mechanical actuator and the transparent elastomer, and the mechanical actuator and the transparent elastomer are arranged such that the mechanical actuator when thermally induced presses the transparent elastomer against the light guide to induce the at least one prism to couple the short wavelength light component into the light-guide.

In a second preferred embodiment, the at least one prism is coated with a dichroic beam splitter that is configured to separate the solar light into:
  the short wavelength light component, and
  the long wavelength light component.

In a third preferred embodiment, the mechanical actuator comprises a phase-change material that produces a volume expansion when the long wavelength component is absorbed, and the phase-change is obtained through focusing of the long wavelength light component by the at least one lens.

In a fourth preferred embodiment, the inventive system is configured such that when the system is exposed to the sun during a movement of the sun, the sun's movement induces a lateral movement in the self-adaptive coupling feature's location allowing for efficient coupling independent of the sun's incidence angle.

In a fifth preferred embodiment, the mechanical actuator further comprises an infrared absorber.

In a sixth preferred embodiment, the infrared absorber comprises carbon black.

In a seventh preferred embodiment the phase-changes material in of the list comprising paraffin, salt hydrates and eutectic compounds.

In an eighth preferred embodiment, the transparent elastomer is PDMS.

In a second aspect the invention provides a solar photovoltaic system comprising the system for capturing solar light of the sun that self-tracks the sun and collects direct sunlight into a photovoltaic cell.

In a third aspect the invention provides a system for collecting and transporting sunlight for day lighting purposes within building structures comprising the system for capturing solar light of the sun.

In a fourth aspect the invention provides a method for capturing solar light from the sun, whereby the solar light comprises a short wavelength light component and a long wavelength light component. The method comprises the steps of focusing the solar light onto a self-adaptive coupling feature, whereby a location of the focused solar light on the self-adaptive coupling feature is dependent of the position of the sun; absorbing in the self-adaptive coupling feature the long-wavelength light component, thereby locally heating up the coupling feature and creating a localized coupling feature; coupling the short wavelength light component into a light-guide at the localized coupling feature; and transporting the short wavelength light component through the light-guide to an edge thereof.

BRIEF DESCRIPTION OF THE DRAWINGS

The invention will be explained in more detail in the following description of preferred embodiments and in view of the drawings wherein

FIG. 2 is a detailed cross-section drawing of the coupling feature. Light from a lens (105) is incident on a slab waveguide (102) and passes through a dichroic beam splitter (110) passing infrared light. The infrared light heats (108) a mixture of phase change material and infrared absorber (107). This heating causes the phase change material to change phase and expand pressing the transparent deformable elastomer (109) against the slab light-guide (102) When unheated, the transparent elastomer (109) and slab light guide (102) are separated by a thin air-gap (106). With contact or near contact between the elastomer and light-guide, short wavelength light that reflects from the dichroic prism facets (110) can now efficiently couple into the light-guide. Subsequent reflections of the short wavelength light within the light-guide reflect efficiently by total internal reflection;

FIG. 11 is an interferometric fringe counting setup for measuring in-plane deflection of a simplified phase-change device. Light from a solar simulator (132) is reflected by a mirror (143) and filtered by a cold mirror (133) before focusing through lens (134) onto the sample (135), creating the localized actuation. An identical lens (139) in the reference arm forms a Linnik interferometer configuration. Interferometry is performed using a collimated broadband light source (138), which is focused through a lens (137), and split by a beamsplitter (136). Light in the sample arm is reflected off the cold mirror (133) onto the sample. Light in the reference arm is reflected by a movable reference mirror (140). The two beams are then recombined on a camera (142) after passing through a bandpass filter (141). Test sample is a layer of paraffin/carbon black and a 300 um PDMS film (no prisms).

DETAILED DESCRIPTION

The techniques, apparatus, materials and systems as described in this specification can be used to implement a self-tracking solar concentrator.

Described is a solar concentrator, which contains a single or a plurality of lenses (101) focused on a self-adaptive device below a slab light-guide (102). The self-adaptive device actuates thermally where the solar focus is located, acting as position dependent coupler, coupling short wavelength light into the light-guide.

FIGS. 1 through 4 show the function of the invention. Sunlight is focused by a lens (a single lens or part of an array of small lenses) (101) onto the actuator device (107), which is composed of a transparent deformable polymer (109) with dichroic prisms molded on its underside. Infrared light is passed by the dichroic reflective layer on the prisms (110) and acts to locally heat up the phase-change material below the prisms (108). When the temperature exceeds the melting point of the phase-change material, it expands locally closing the air-gap (106) which separates the elastomer (109) and slab light guide (102), vertically pressing the deformable elastomer (109) into the waveguide and allowing for efficient coupling into the light-guide. As the sun moves across the sky, the location of the expanded phase-change material moves laterally (for example, left to right in FIG. 1) across the device allowing for efficient coupling wherever the high intensity solar spot is focused.

The self-tracking mechanism requires a solar induced actuator, in this case, a thermal phase-change actuator, which actuates locally depending on the location of the focused image of the sun as seen by a lens or an array of lenses. This invention uses thermally actuated phase-change materials to auto-align and induce efficient coupling into a slab light-guide using reflective prisms (specular reflection) to couple light into the slab light-guide where light from a single lens or an array of lenses is combined and transported to a PV cell electrical conversion, or into a building for daylighting purposes.

In at least one embodiment, the phase change material used for thermal actuation is paraffin wax. Paraffin waxes are the name for hydrocarbon chains $C_nH_{2n+2}$, and its mixtures. Chains with more than 20 carbon atoms are solid at room temperature with a melting temperature dependent on the length of the carbon chain. In this way paraffin waxes can be chemically tailored to have reliable melting points almost anywhere between 18° C. and 130° C. (http://www.igiwax.com/). Paraffin wax is an attractive reversible actuator material in this invention since it has a very large volume expansion of 10-20% on phase change and can operate even when loaded with hundreds of Megapascals (MPa). It also has a response time suitable for tracking the motion of the sun. To make a paraffin wax absorptive to solar radiation it must be mixed with an absorbing material. In at least one embodiment, Carbon Black is mixed with the paraffin wax in the liquid phase to make the device black and absorbing.

A dichroic beam splitter separates the light into two components to be used by the system:
1) short wavelength light (ultraviolet (UV)—visible—near infrared (NIR)) is reflected by the beamsplitter and is coupled into the light-guide and sent to the output of the concentrator;
2) long wavelength sunlight (near infrared (NIR)—infrared (IR)), representing the portion of the spectrum not efficiently used at the output of the concentrator (limited PV cells in the IR range), is transmitted through the dichroic splitter and absorbed for localized heating and thermal actuation of the phase change material.

Although we have described a single split between short and long wavelength light, another embodiment would use a more complex multiband beam splitter to further divide the sunlight for the efficiency, tolerance or manufacturability of the system. The transmitted (thermal actuation) and reflected (coupled light) bands may also be chosen depending on the application. For example a Silicon cell can utilize wavelengths from 400-1100 nm (GaAs cells can utilize wavelength from 400 nm to 800 n~nm), so ideally the solar spectrum outside of this band would be transmitted for thermal actuation. Day lighting systems, on the other hand only benefit by coupling the visible part of the spectrum 390-750 nm, leaving a larger proportion of the solar energy for thermal actuation.

Background: Planar Micro-Optic Solar Concentrator

The proposed invention is an improvement to the planar micro-optic solar concentrator, described by
system and method for solar energy capture and related method of manufacturing, United States Patent Application 20110226332, International Application No.: PCT/US2009/057567.

Jason H. Karp, Eric J. Tremblay, and Joseph E. Ford, "Planar micro-optic solar concentrator," Opt. Express 18, 1122-1133, 2010.

The planar micro-optic concentrator of Ford et al. also includes an array of lenses coupling into a waveguide using prism facets.

Background: Prior Art, Other Approaches to Self-Tracking

Ford et al. describe a method for self-tracking the sun (United States Patent Application 20110226332) (K. A. Baker, J. H. Karp, E. J. Tremblay, J. M. Hallas, and J. E. Ford, "Reactive self-tracking solar concentrators: concept, design, and initial materials characterization," Appl. Opt. 51, 1086-1094, 2012). However, the method described by Ford et al. utilizes a large change of index of refraction in a liquid for light-guide coupling, rather than the reversibly mechanical mechanism described in this patent.

In addition, Schmaelzle et al. have described a self-tracking mechanism using scattering from a phase-change hydrogel (P. H. Schmaelzle and G. L. Whiting, "Lower Critical Solution Temperature (LCST) Polymers as a Self Adaptive Alternative to Mechanical Tracking for Solar Energy Harvesting Devices." Materials Research Society (MRS) Fall Meeting 2010 (abstract)) (U.S. patent application Ser. No. 12/955,6888) (U.S. patent application Ser. No. 12/955,743). Although also based on a thermal phase-change material, Schmaelzle et al's approach relies on scattering (rather than specular reflection) directly from within a liquid waveguide.

Device Fabrication

Figure 1A:
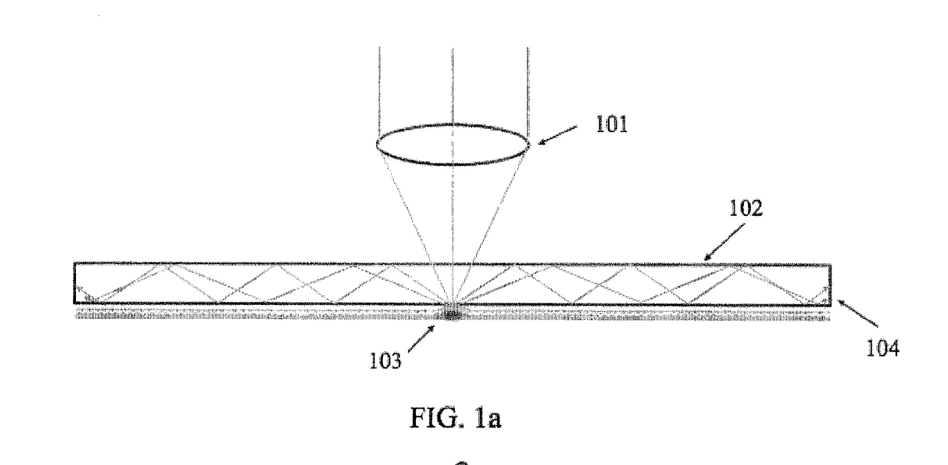
FIG. 1a is a cross-section drawing of the self-tracking solar concentrator device on axis. Light with direction normal to the plane of the glass light-guide (102) is focused by a lens (101) to a point where a thermal coupling feature is formed (103) by heating due to the infrared light passing through the dichroic beam splitter. The thermal coupling feature reflects the desirable short wavelength light into the light-guide to the output at the edges (104)
Figure 1B:
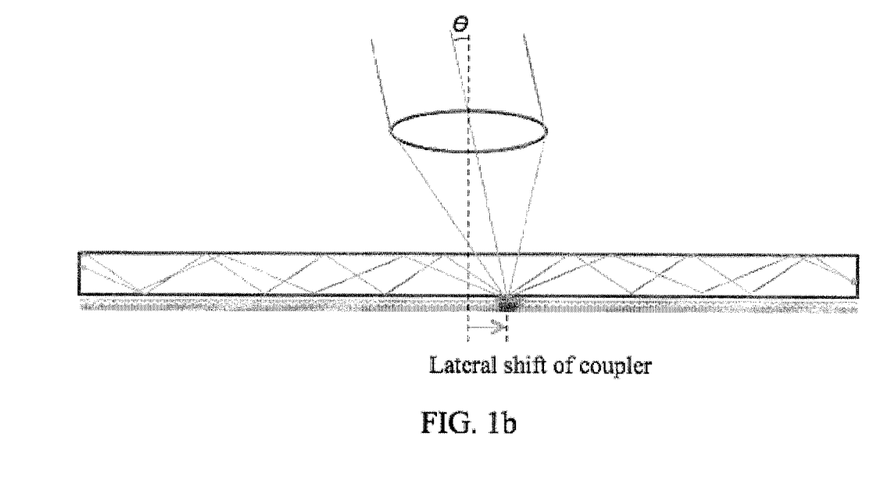
FIG. 1b is a cross-section drawing of the self-tracking solar concentrator at an arbitrary oblique angle, θ. Light focused by the lens will focus at a position shifted laterally compared to the on-axis illumination. The thermal coupling feature will form or follow the light focus, now located at the shifted light focus.
Figure 2:
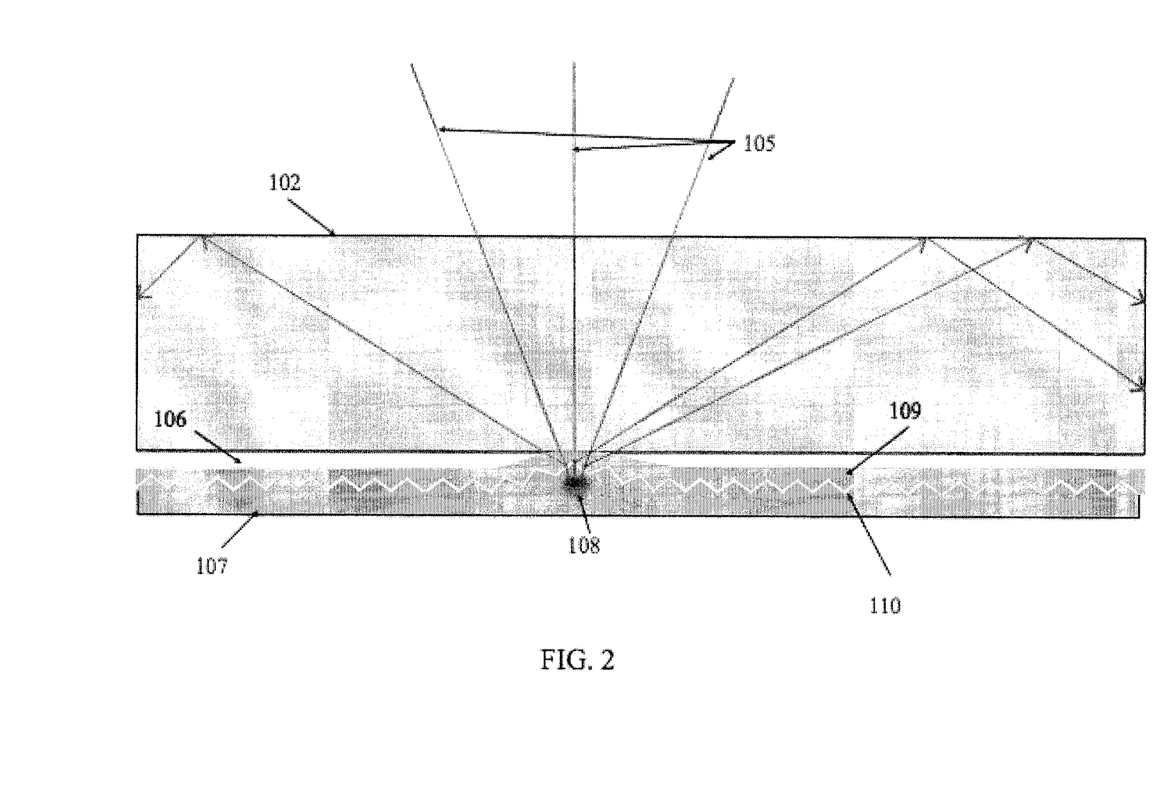
Figure 3:
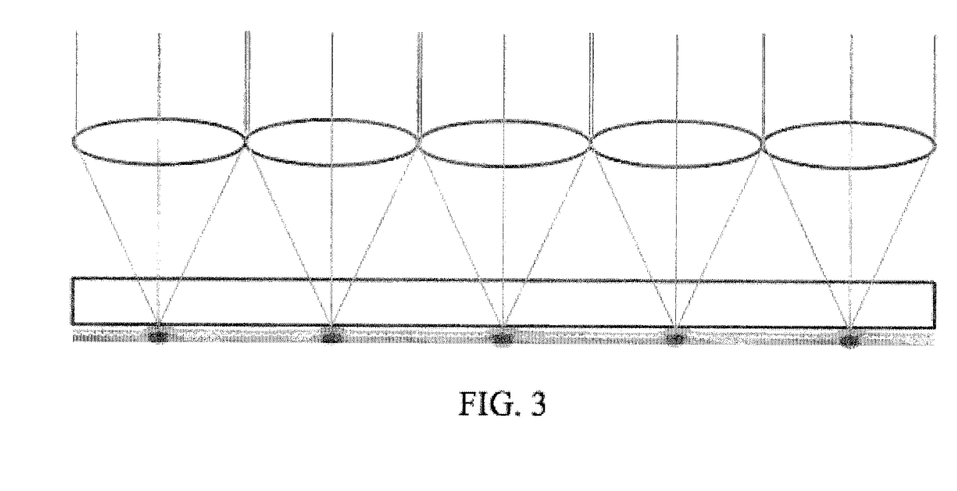
FIG. 3 is an array of lenses each creating a coupling features below a light-guide.
Figure 4:
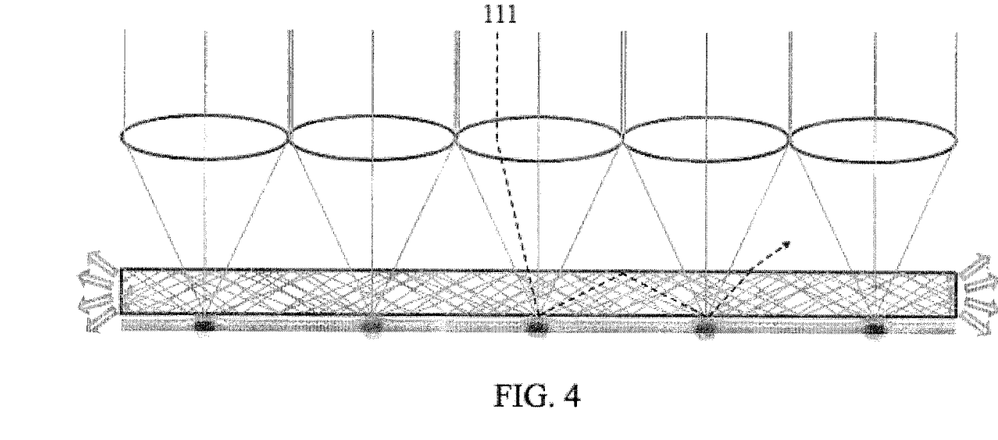
FIG. 4 is the coupling of an array of lenses into the light by a corresponding array of aligned thermal coupling features. A single ray is shown as a dashed line (111) corresponding to the potential for rays that coupled into the light-guide to couple out again through interactions with neighboring coupling features.
Figure 5:
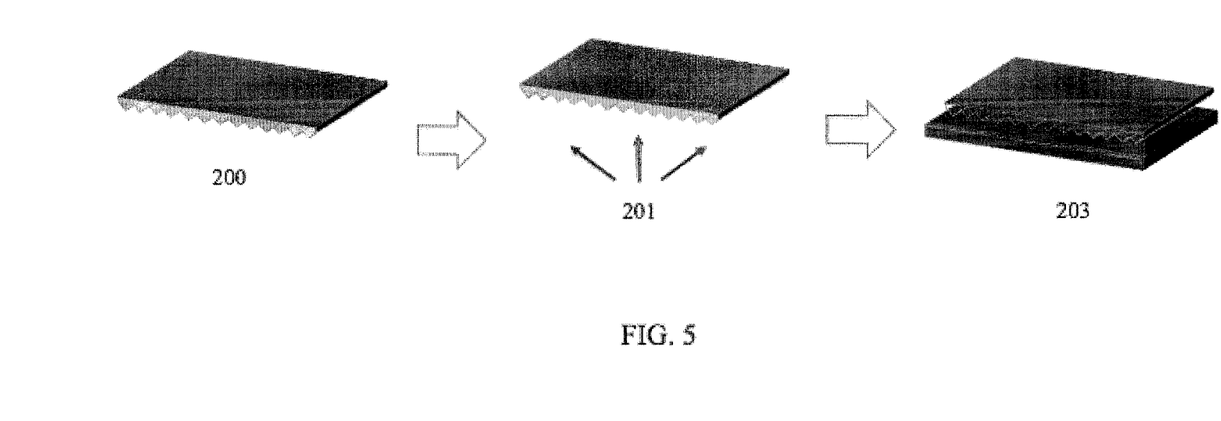
FIG. 5 is a simple process for creating the thermal coupling layer. A Prism is molded into PDMS layer (200). The prisms are coated with a dichroic beam splitter coating (201). A mixture of Paraffin wax and carbon black is pressed or spin coat onto the prism and molded at elevated temperature (202)

To fabricate the actuator layer of our device, a simple example process of an embodiment of the invention is shown in FIG. 5 using Polydimethylsiloxane (PDMS) elastomer as the transparent deformable polymer. First a prism array is molded or embossed into a thin elastomeric membrane. Next, that prism array is coated with a dichroic spectral reflector that reflects the visible portion of the light, which is sent to the PV cell, and transmits the infrared spectrum used for thermal actuation. Finally, the prism layer is pressed together with a phase change material, such as paraffin wax mixed with black dye (carbon black). This actuator layer is placed beneath the glass waveguide with a small air or liquid space which acts as a cladding layer for the waveguide. A lens or lenslet array on top of the glass waveguide is used to focus sunlight locally on the actuator material and prismatic reflectors.

Proof of Principle Demonstration and Measurements

As a proof of principle experimental demonstration, we demonstrate the effect of FTIR by using a prism coupler on a simplified actuator device. The simplified device consists of two layers:
1) a lower layer consisting of a mixture of paraffin (Merck, melting point 42-44° C.) and Carbon black (Cancarb N991) solidified into a thin solid film (~200 μm thick), and
2) an upper 300 μm thick flat film of PDMS. Separated by a small air space on top of the PDMS, a dove prism was placed from which to observe changes in TIR on the prism's bottom surface. Simulated solar light from a 300 W solar simulator producing 1 sun at 15 cm distance from the solar simulator's aperture was first filtered using a standard infrared cold mirror (Thorlabs FM03) to remove the visible part of the solar simulator spectrum and focused using an achromatic lens (30 mm focal length, 17 mm aperture) onto the surface of the simplified device.

When the solar simulator was turned on, a round region of black FTIR of approximately 1.5 mm around the focused spot from the solar simulator was observed almost immediately.

The location of FTIR was found to track with the location of the solar simulator focus and to completely disappear within less than 1 second after removal of the solar simulator light. This experiment demonstrates the actuation and its reversibility.

In a second experiment, the height of the in-plane deformation was measured. Here a modified Michelson interferometer (Linnik) was used to observe and count fringes during actuation from a specular reflection from the top surface of the PDMS. Examination of a recorded video allows us to measure an in-plane deflection of 19 μm. We estimate that the actual deflection is somewhat larger than this due to the preliminary measurement system's limited video frame rate and maximum number of recordable frames. This experiment confirms that the actuation is caused by a deformation of the material by phase change.

Optical Design and Overall System Concept

Figure 6:
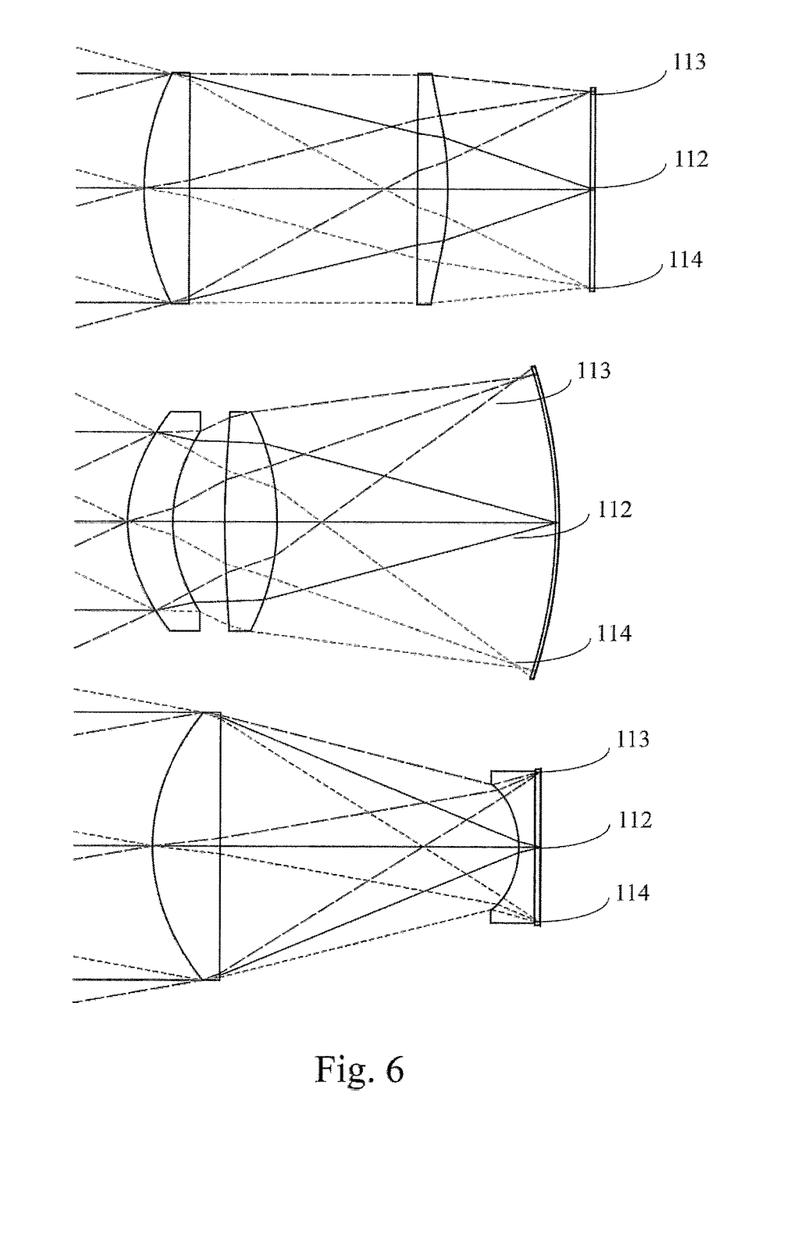
FIG. 6 depicts several possible lens concentrator designs optimized for an enlarged field of view. The center design uses a curved (spherical) light-guide, while the outer lens designs are designed for a flat field and planar light-guide. These designs could be implemented as lens arrays. For each of the three example designs, three field angles are shown: on axis (112), maximum (113) and minimum (114) fields.
Figure 7:
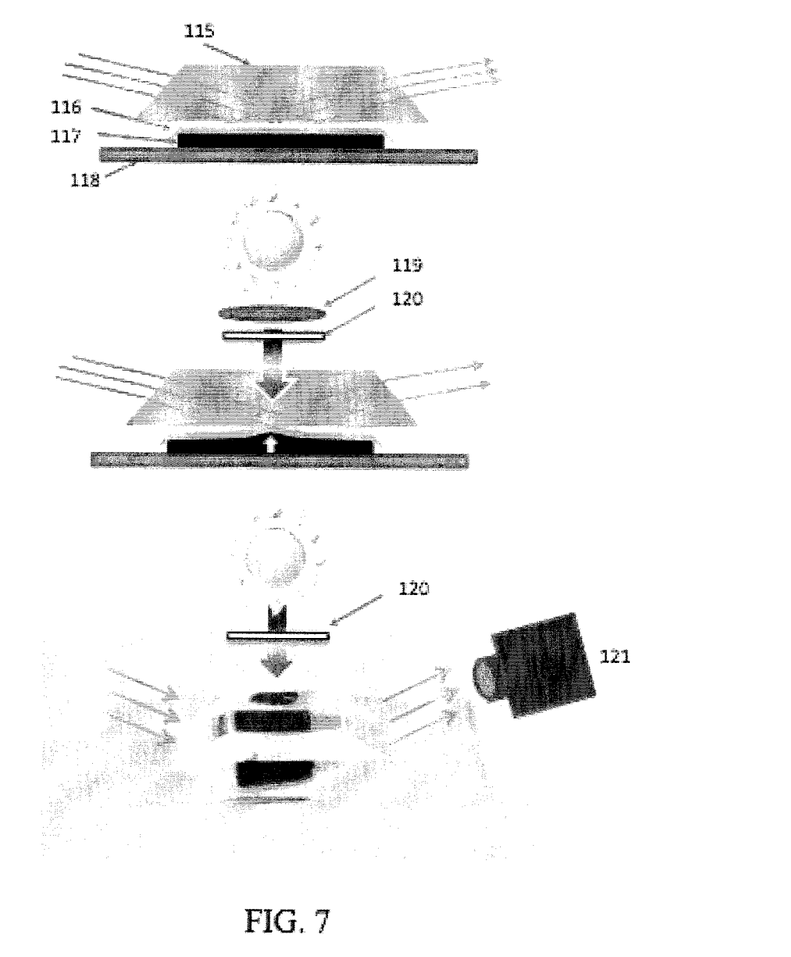
FIG. 7 is a method to demonstrate, observe and measure solar induced FTIR using a dove prism and a simplified device structure. A dove prism (115) is placed above the actuator (117), which is covered by a thin elastomeric layer (116). The actuator rests on a glass slide (118). When light from the sun or a solar simulator is present on the device through a lens (119) and visible light blocking filter (120), the actuator layer expands, causing the elastomer to make contact with the bottom of the dove prism. FTIR can be viewed and measured with a camera (121)
Figure 8:
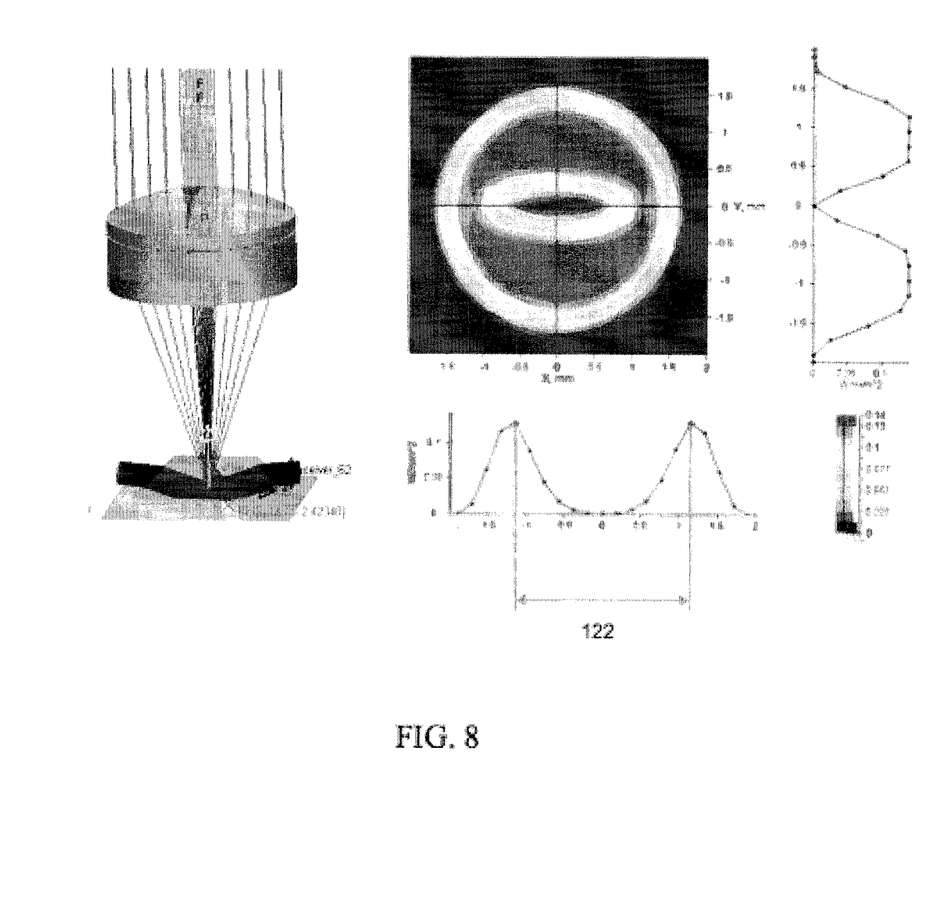
FIG. 8 is an optical simulation of the dove prism FTIR setup of FIG. 7. The trough indicated in the irradiance profile (122) shows the effect of FTIR.
Figure 9:
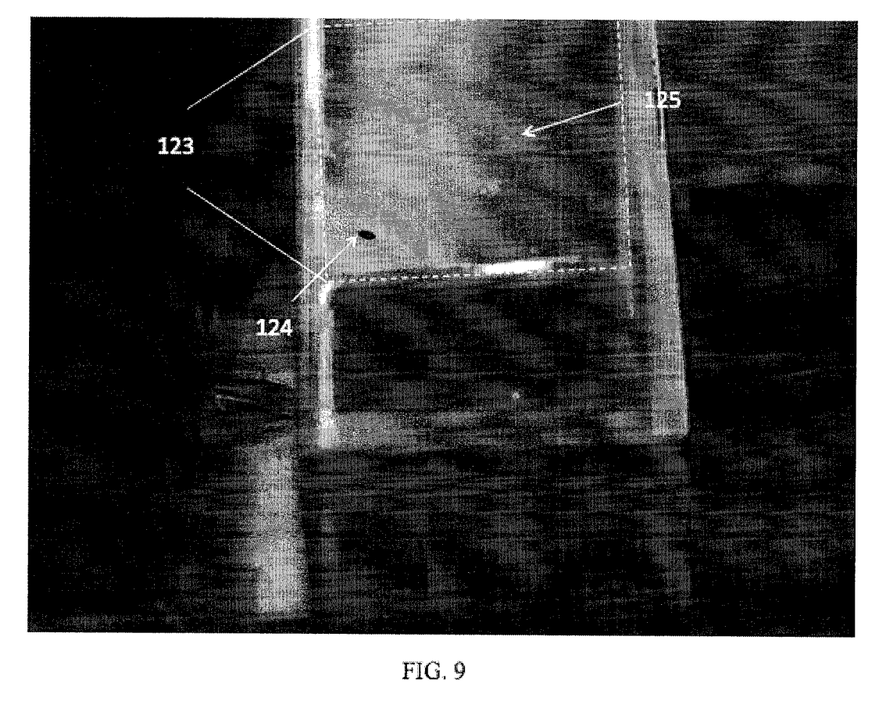
FIG. 9 is an image looking directly into the dove prism described by FIG. 7 and FIG. 8. The reflection from the bottom of the dove prism (123) is visible indicating TIR. A defect (124) can be seen where contact is made between the base of the prism and the actuator. A faint reflection (125) is also visible at the location where the light actuation will take place.
Figure 10:
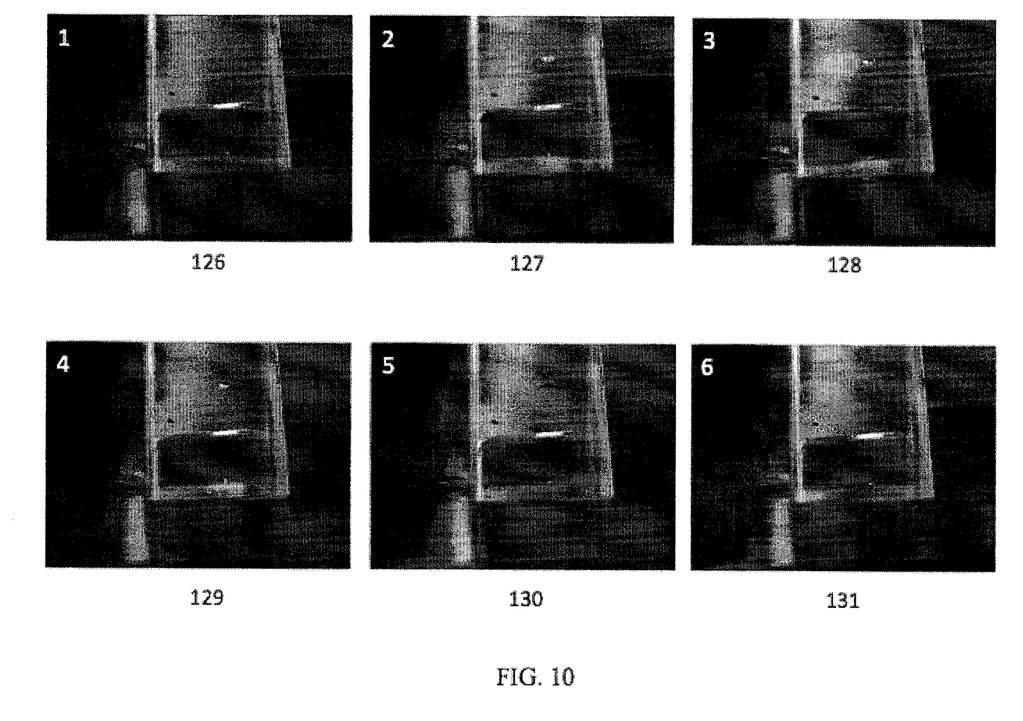
FIG. 10 shows movie frames from a dove prism FTIR experiment. In these frames FTIR is observed around a focused spot of infrared light from a filtered solar simulator. Before Solar simulator turned on (126). Solar simulator turned on: FTIR just visible (127). 1 sec: FTIR clearly visible (128). 3 sec: FTIR clearly visible with stable size (129). Solar simulator turned off: FTIR spot begins to disappear (130). <1 sec after solar simulator turned off: TIR completely restored (131)
Figure 11:
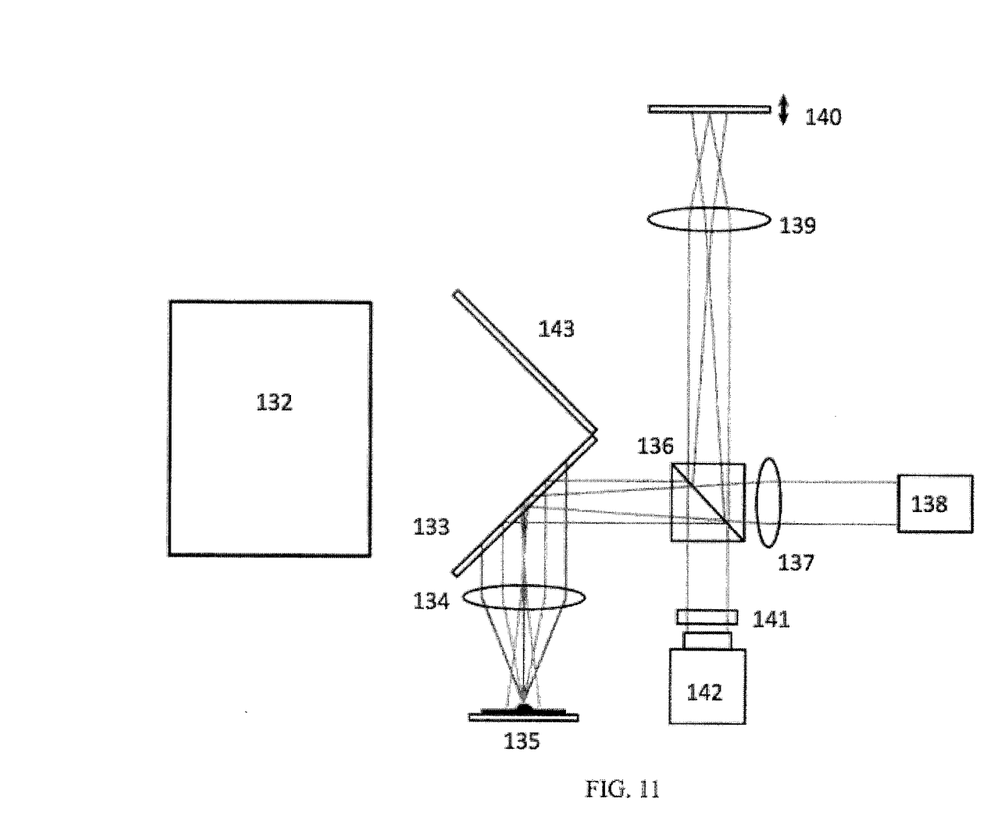

In at least one embodiment, solar concentrators need to be tailored to the field of view and concentration required. For small field of view systems where the mechanism is used to relieve the alignment tolerances of an external tracker, a simple singlet lens or plurality of lenses may be all that is required. In larger field of view systems, more complex lens systems will be necessary to provide acceptable off-axis performance over the field of view. FIG. 6 shows three example designs using two lenses for off-axis field correction. The leftmost lens in FIG. 6 uses two plano-aspheric elements in a lens and field flattener arrangement for use with a planar waveguide. The middle lens in FIG. 6 uses two bi-aspheric plus a curved (spherical) light-guide to compensate for field curvature. Additionally, the right-most lens in FIG. 6 shows an arrangement of two bi-aspheric lenses for a corrected flat-field and planar light-guide.

Additionally, in at least one embodiment, the light-guide can be shaped for maximum concentration; for example by using a trough shape and mirrored side-walls for additional concentration.

The invention claimed is:

1. A system for capturing solar light of the sun, whereby the solar light comprises a short wavelength light component and a long wavelength light component, the system comprising:
    at least a lens,
    a light-guide, and
    a self-adaptive coupling feature,
    whereby the at least one lens is arranged adjacent to the light-guide in order to focus the long wavelength component onto the self-adaptive coupling feature, and the self-adaptive coupling feature is configured to couple the short wavelength light component into the light-guide,
    wherein the self-adaptive coupling feature comprises
        a mechanical actuator that is configured to be thermally induced by absorbing the long wavelength light component and to be reversible,
        a transparent elastomer, and
        at least a reflecting prism,
        whereby the mechanical actuator and the transparent elastomer are arranged such that the mechanical actuator when thermally induced presses the trasnsparent elastomer against the light guide to induce the at least one prism to couple the short wavelength light component into the light guide.

2. The system of claim 1
    whereby the at least one reflecting prism is arranged between the mechanical actuator and the transparent elastomer.

3. The system of claim 1, wherein the at least one prism is coated with a dichroic beam splitter that is configured to separate the solar light into:
    the short wavelength light component, and
    the long wavelength light component.

4. The system of claim 1, wherein the mechanical actuator comprises a phase-change material that produces a volume expansion when the long wavelength component is absorbed, and the phase-change is obtained through focusing of the long wavelength light component by the at least one lens.

5. The system of claim 1, configured such that when the system is exposed to the sun during a movement of the sun, the sun's movement induces a lateral movement in the self-adaptive coupling feature's location allowing for efficient coupling independent of the sun's incidence angle.

6. The system of claim 4, wherein the mechanical actuator further comprises an infrared absorber.

7. The system of claim 6, wherein the infrared absorber comprises carbon black.

8. The system of claim 4, wherein the phase-changes material in of the list comprising paraffin, salt hydrates and eutectic compounds.

9. The system of claim 1, wherein the transparent elastomer is PDMS.

10. A solar photovoltaic system comprising the system for capturing solar light of the sun according to claim 1 that self-tracks the sun and collects direct sunlight into a photovoltaic cell.

11. A system for collecting and transporting sunlight for day lighting purposes within building structures comprising the system for capturing solar light of the sun according to claim 1.

* * * * *